United States Patent
Faulk, Jr.

(10) Patent No.: US 6,256,756 B1
(45) Date of Patent: Jul. 3, 2001

(54) EMBEDDED MEMORY BANK SYSTEM

(75) Inventor: Robert L. Faulk, Jr., Roseville, CA (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/205,489

(22) Filed: Dec. 4, 1998

(51) Int. Cl.[7] .............................. G11C 29/00; H02H 3/05
(52) U.S. Cl. ................................ 714/718; 714/8; 714/42
(58) Field of Search ...................................... 714/718, 723, 714/710, 711, 763, 765, 5, 7, 8, 15, 20, 42, 54

(56) References Cited

U.S. PATENT DOCUMENTS

| | | | |
|---|---|---|---|
| 5,077,737 | * 12/1991 | Leger et al. | 714/6 |
| 5,105,425 | * 4/1992 | Brewer | 714/8 |
| 5,862,314 | * 1/1999 | Jeddeloh | 395/182.06 |
| 6,088,817 | * 7/2000 | Haulin | 714/42 |

* cited by examiner

Primary Examiner—Christine T. Tu

(57) ABSTRACT

A component with embedded memory is manufactured. The component includes a plurality of memory buffers and a processor. During self-test of the component, the processor performs testing of the plurality of memory buffers in order to detect bad memory locations. The processor places into a free buffer list pointers to memory buffers from the plurality of memory buffers for which no bad memory locations have been detected.

22 Claims, 1 Drawing Sheet

EMBEDDED MEMORY BANK SYSTEM

BACKGROUND

The present invention concerns integrated circuits and pertains particularly to an improved memory bank system which increases manufacturing component yield.

Many integrated circuits (components) have embedded memory cells used for the storage of information. When manufacturing components which have embedded memory, defects in the memory cells make the memory cell unusable. If the memory errors caused by the defects are uncorrected, the entire component is unusable, and the overall manufacturing yield is reduced.

A typical memory contains multiple blocks ("banks"). Each block contains many memory cells. Each memory cell normally contains a single bit of data, although some technology permits more than one bit of data per memory cell. As the size of the memory gets larger there is an increased chance that there is an error in a memory cell. For example, if P(G) is the probability of a memory bit being good, then the probability of zero errors in a memory of n bits is $P(G)^n$.

For example, if P(G)=0.99 and there are 100 memory cells, the probability of zero errors is $0.99^{100}$ which is approximately equal to 0.37. Thus, the probability of zero errors in a large memory can be very, very small.

There are several techniques for working around bit errors in memory, thus increasing the yield of components with embedded memory.

For example, memory bank remapping can be performed. In this method, the manufacturers build in additional spare blocks of memory. When the memory is manufactured, all memory blocks are tested. If a memory block has any bit errors, the block is mapped out and one of the spare blocks is mapped into its place. Often called "self-repair", this remapping is done by disconnecting the failed memory block and rewiring a spare memory block into its place. If there are no bit errors, the spare memory blocks are unused. If there are more blocks with bit errors than there are spare blocks, the entire component cannot be used, and the yield is reduced. However, generally memory bank remapping is costly and cumbersome to implement.

Another technique used to increase the yield of components with embedded memory is the use of error correcting memory. Although many variants exist, each word of error correcting memory typically has 12 memory cells which hold the data and the error correction bits. An error-correction function is applied to the data and error correction code, yielding an 8 bit result. The error correction function is typically able to correct a single bit error, and detect 2 bit errors. Because of its high additional cost, error correcting memory is used primarily in mission-critical systems where very high reliability is required. Error correcting memory is not a low cost method of increasing yield.

SUMMARY OF THE INVENTION

In accordance with the preferred embodiment of the present invention, a component with embedded memory is manufactured. The component includes a plurality of memory buffers and a processor. The size of these memory buffers can be determined independently of the size of the memory banks. During self-test of the component, the processor performs testing of the plurality of memory buffers in order to detect bad memory locations. The processor places into a free buffer list pointers to memory buffers from the plurality of memory buffers for which no bad memory locations have been detected.

In the preferred embodiment, the processor identifies in an error log memory buffers in which bad memory locations have been detected. For example, the error log is stored in non-volatile memory. This allows the error log to permanently identify memory buffers in which bad memory locations were detected during testing which was performed as part of a manufacturing process of the component as well as by the processor during component self test.

During normal operation of the component, a buffer manager accesses the free buffer list to determine which memory buffers are currently available. Entities within the component make requests for memory buffers to the buffer manager. For example, the component is a network switch and the entities are each a switch port.

The present invention has significant advantages over prior art solutions. For example, the present invention is superior to the practice of mapping out defective memory blocks (also called bank swapping), for example, because no internal "rewiring" is needed to swap a good block in place of a defective block. Additionally, in embodiments of the present invention there is no performance delay, which is often the case with the bank swapping mechanisms.

With bank swapping, the spare memory banks are unavailable unless they are swapped into the place of a defective memory block. The present invention allows all good blocks of memory to be used, which increases efficiency.

Another advantage of the described embodiments of the present invention over solutions which map out defective blocks is that for embodiments of the present invention the block size and number of spare blocks need not be constrained by the physical memory organization. For example, a single large embedded memory can be used, or multiple smaller memories can be used. The block size can be any size, as long as there is enough room in the free buffer list. With bank swapping, the spare blocks must be tightly associated with the blocks they can replace. If a spare block is not tightly coupled with the block it replaces, a significant performance degradation will occur because of the extra circuitry needed and physical distance between the spare block and the block it replaces.

Additionally, the disclosed embodiments of the invention provide a higher level of system reliability over systems which use bank swapping. In described embodiments of the present invention, when faults are detected after manufacture, these faults can be permanently logged. Thus, intermittent faults are more likely to be detected.

The present invention is also superior to those prior art solutions which use error correcting memory. Error correcting memory typically requires the addition of 4 extra bits for every 8 bits of memory resulting in a greater than 50% increase in memory component size. Additionally, error correcting memory has higher latency because additional processing must be done for each of the bits read from memory before the data is passed on to other modules in the system. Because of its high cost, error correcting memory is used to increase system reliability, and is not generally considered as a solution to increasing yield.

DESCRIPTION OF THE PREFERRED EMBODIMENT

Figure 1:
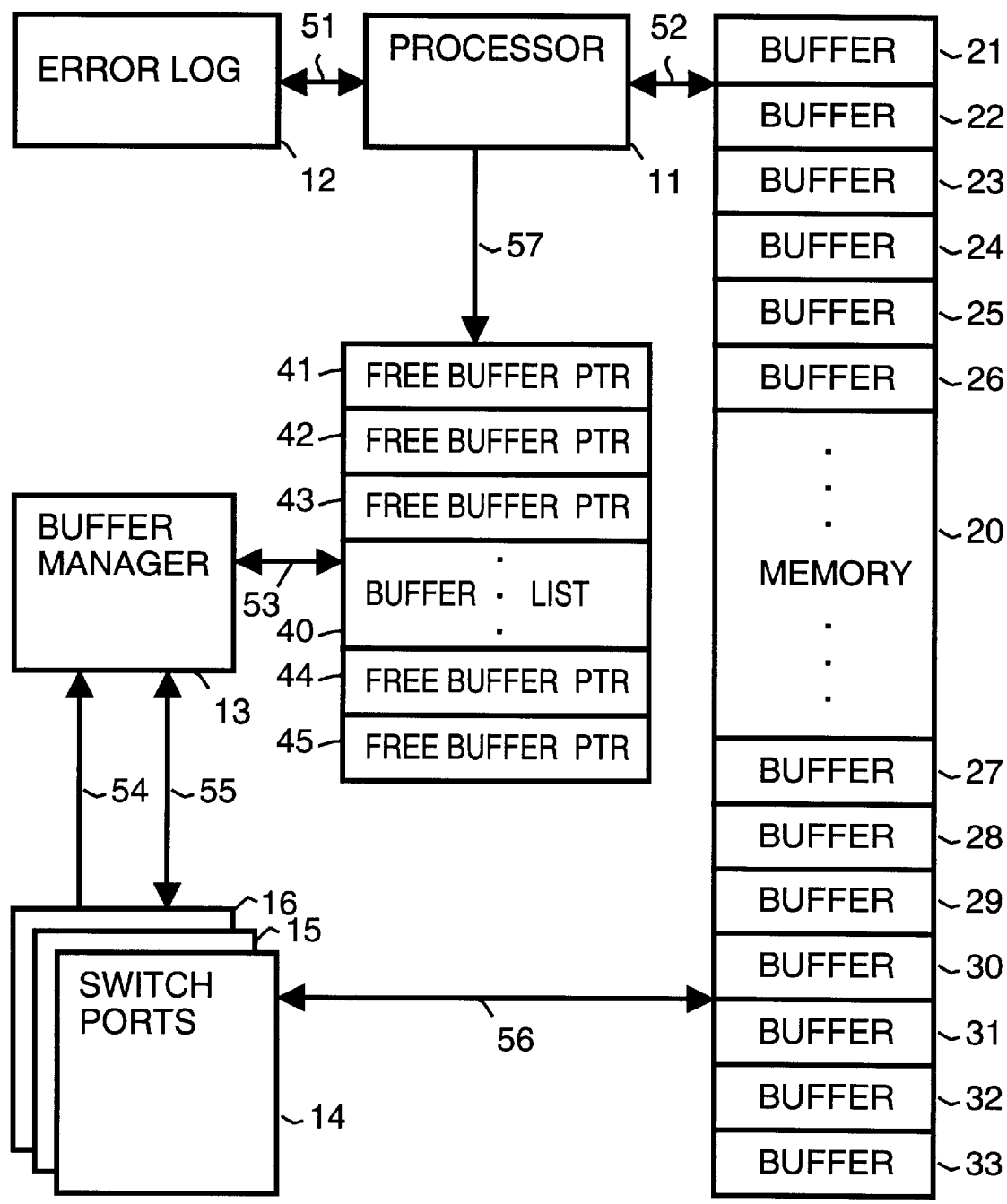
FIG. 1 is a simplified block diagram of memory and memory management logic within a component which uses embedded memory in accordance with a preferred embodiment of the present invention.

FIG. 1 is a simplified block diagram which shows a memory 20 and memory management logic within a component. For example, the component is an Ethernet switch. Alternatively, the component is any other entity which utilizes memory buffers.

The memory space of memory 20 is broken up into memory blocks. The memory blocks need not be related to any actual physical structures of memory 20. The preferred block size varies depending on application and memory failure characteristics. For an Ethernet switch system using embedded memory, the preferred block size is 128 bytes, although the optimal size will vary, dependent on the size of packets present on the particular Ethernet network being used. While in the preferred embodiments of the present invention, memory 20 is embedded within the component, in alternative embodiments, memory could be separate from the remainder of the component.

For example, FIG. 1 shows memory 20 including a buffer 21, a buffer 22, a buffer 23, a buffer 24, a buffer 25, a buffer 26, a buffer 27, a buffer 28, a buffer 29, a buffer 30, a buffer 31, a buffer 32 and a buffer 33. Buffers 21 through 33 are only representative. The number of buffers and the size of each buffer is dependent upon the component and the application for which the component is used.

When the component is manufactured, each buffer of embedded memory 20 is tested to locate defective memory locations. As bad memory locations are discovered, the memory buffers which contain the bad memory locations are identified in an error log 12.

Since error log 12 is stored within the component, there is a record of memory buffers which cannot be used. For example, error log 12 is implemented using Flash EEPROM or some form of one-time-programmable storage such as fused-link ROM built into the component. Alternatively, error log 12 may be located outside the component.

In an alternative embodiment, rather than making a record in an error log, memory buffers with defective memory locations can be marked by permanently setting defective memory locations to a "1" value or a "0" value. This will assure that during self-test of the component, the memory locations will always be detected and not used by the component. By permanently setting the defective memory locations, this eliminates the opportunity for a defect of an intermittent nature to later go undetected during the component self-test.

If an excessive number of buffers with defective memory cells are detected, the component is discarded. For example, the manufacturer publishes a data sheet which rates the component as having at least "n" available memory buffers. If there are enough memory buffers with errors so that the component no longer has at least "n" available memory buffers, the component is discarded and the manufacturing yield is thus reduced. When designing the memory buffer, it is advisable to include enough extra memory buffers so that a high percentage of components will have at least "n" available memory buffers without defective memory cells.

When the component is in normal use, a memory test is also performed. This test detects problems which manifest themselves after the component has been tested by the manufacturer. For example the memory test is performed as part of the power-up self-test of the component.

For example, in the preferred embodiment of the present invention, the self-test is performed by a processor 11 within the component. In alternative embodiments, rather than using a processor, another logic block, such as a state machine, can be used to replace processor 11.

In the preferred embodiment, processor 11, using a data path 51, reads the information already recorded in error log 12 to determine which buffers have already been marked as having bad memory locations. Then processor 11 uses a data path 52 to perform a test of the remaining buffers to determine if any additional buffers have defective memory locations. When errors are detected by processor 11, processor 11 logs in error log 12 which additional buffers have been discovered to have bad memory locations. As mentioned before, error log 12 is preferably either a non-volatile memory or a one-time programmable memory. This reduces the chance of an intermittent failure later going undetected.

Thus once an error is detected for a memory location (either during manufacturing or subsequently during self-test) the buffer which contains the defective memory location is permanently marked as unusable.

Once processor 11 has performed the memory test, processor 11, via a data path 57, places free buffer pointers within free buffer list 40. The free buffer pointers point to those buffers in memory 20 for which no bad memory locations have been detected. For example, in FIG. 1, the free buffer pointers are represented by a free buffer pointer 41, a free buffer pointer 42, a free buffer pointer 43, a free buffer pointer 44 and a free buffer pointer 45. In the preferred embodiment, at initialization the actual number of potential free buffer pointers is equal to the total number of free buffers (good and bad) within memory 20. However, buffers which have one or more bad memory locations are not added to free buffer list 40.

The component is considered good as long as there are at least a predetermined ("n") number of good buffers remaining in memory 20. The number is predetermined, for example, during the design of the component. When the number of good memory buffers is less than the predetermined number, the component is discarded.

During operation, when a memory buffer is needed, a buffer manager 13, obtains a free buffer pointer, through a data path 53, and returns the free buffer pointer to a requesting entity.

For example, when the component is an Ethernet switch, the component will have a plurality of switch ports, represented in FIG. 1 by a switch port 14, a switch port 15 and a switch port 16.

When one of the switch ports needs a buffer to receive a packet, the switch port, through a buffer request data path 54, requests a buffer from buffer manager 13. Buffer manager 13, through data path 53, will check free buffer list 40 to see if there are any available free buffers. If free buffer list 40 has one or more free buffer pointers, buffer manager 13 removes a free buffer pointer from free buffer list 40 and passes the free buffer pointer, through a data path 55, to the requesting switch port.

If there are no free buffer pointers, the packet cannot be received and will be dropped. Once the switch port has the free buffer pointer, it transfers the packet using a data path 56, into buffer memory 20. If the packet is larger than 128 bytes, the switch port will request additional buffers as needed to fit the entire packet into memory 20. After the packet is received, ownership of the buffer(s) is transferred to other switch ports in the system. The last switch port in the system to finish using a buffer returns the buffer to buffer manager 13. Buffer manager 13 then, through data path 53, replaces the associated free buffer pointer back onto free buffer list 40.

While the embodiment of the present invention shown in FIG. 1 uses a separate buffer manager 13, in alternative embodiments of the present invention, the functionality of buffer manager 13 may be performed by a software buffer management module running on processor 11. The buffer management module could, for example, be called when other software modules running on processor 11 need to obtain memory to accomplish processing tasks.

The foregoing discussion discloses and describes merely exemplary methods and embodiments of the present invention. As will be understood by those familiar with the art, the invention may be embodied in other specific forms without departing from the spirit or essential characteristics thereof. Accordingly, the disclosure of the present invention is intended to be illustrative, but not limiting, of the scope of the invention, which is set forth in the following claims.

I claim:

1. A component with embedded memory comprising:
   a plurality of memory buffers;

a processor, which during self-test of the component, performs testing of the plurality of memory buffers in order to detect bad memory locations;

a free buffer list into which the processor places pointers to memory buffers from the plurality of memory buffers for which no bad memory locations have been detected; and, a buffer manager which during normal operation of the component, accesses the free buffer list to determine which memory buffers are currently available.

2. A component as in claim 1 additionally comprising:

an error log into which the processor identifies memory buffers in which bad memory locations have been detected.

3. A component as in claim 1 wherein the error log is stored in nonvolatile memory.

4. A component as in claim 2, wherein the error log permanently identifies memory buffers in which bad memory locations were detected during testing which was performed as part of a manufacturing process of the component.

5. A component as in claim 1, additionally comprising additional entities which make requests for memory buffers to the buffer manager.

6. A component as in claim 5, wherein the component is a network switch and the additional entities are switch ports.

7. A method by which a component uses memory, the method comprising the following steps:

(a) testing a plurality of memory buffers within the memory, the testing being performed in order to detect bad memory locations within the plurality of memory buffers;

(b) placing into a free buffer list pointers to memory buffers from the plurality of memory buffers for which no bad memory locations have been detected; and, (c) accessing, by a buffer manager during normal operation of the component, the free buffer list to determine which memory buffers are currently available.

8. A method as in claim 7 additionally comprising the following step:

(d) identifying within an error log, memory buffers in which bad memory locations have been detected.

9. A method as in claim 7 wherein in step (c) the error log is stored in non-volatile memory.

10. A method as in claim 7, additionally comprising the following step:

(d) making requests to the buffer manager, by additional entities within the component, for memory buffers.

11. A method as in claim 10, wherein the component is a network switch and the additional entities are switch ports.

12. A method for manufacturing a component which uses memory, the method comprising the following steps:

(a) providing within the memory a plurality of memory buffers;

(b) providing within the component a free buffer list on which to place pointers to memory buffers from the plurality of memory buffers for which no bad memory locations have been detected;

(c) testing the plurality of memory buffers in order to detect bad memory locations;

(d) permanently identifying memory buffers which have bad memory locations; and, (e) providing within the component a buffer manager which during normal operation of the component, accesses the free buffer list to determine which memory buffers are currently available.

13. A method as in claim 12 wherein in step (d) the memory buffers are identified within an error log.

14. A method as in claim 12 wherein in step (d) the memory buffers are identified by permanently setting bad memory locations to a particular value.

15. A method as in claim 12 additionally comprising the following step:

(f) providing within the component a processor, which during self-test of the component, performs testing of the plurality of memory buffers in order to detect bad memory locations.

16. A method as in claim 15 wherein in step (e), the processor places into the free buffer list pointers to memory buffers from the plurality of memory buffers for which no bad memory locations have been detected.

17. A method as in claim 12, additionally comprising the following step:

(f) providing within the component additional entities which make requests to the buffer manager for memory buffers.

18. A method as in claim 12 additionally comprising the following step:

(f) rejecting the component when there are not a predetermined number of memory buffers in which no bad memory locations have been detected.

19. A method as in claim 12 wherein in step (a) the memory is embedded within the component.

20. A method for manufacturing a component which uses memory, the method comprising the following steps:

(a) providing within the memory a plurality of memory buffers;

(b) providing within the component a free buffer list on which to place pointers to memory buffers from the plurality of memory buffers for which no bad memory locations have been detected;

(c) testing the plurality of memory buffers in order to detect bad memory locations; and, (d) permanently identifying memory buffers which have bad memory locations wherein the memory buffers are identified by permanently setting bad memory locations to a particular value.

21. A method by which a component uses memory, the method comprising the following steps:

(a) testing a plurality of memory buffers within the memory, the testing being performed in order to detect bad memory locations within the plurality of memory buffers;

(b) placing into a free buffer list pointers to memory buffers from the plurality of memory buffers for which no bad memory locations have been detected; and, (c) permanently identifying memory buffers which have bad memory locations wherein the memory buffers are identified by permanently setting bad memory locations to a particular value.

22. A component with embedded memory comprising:

a plurality of memory buffers;

a processor, which during self-test of the component, performs testing of the plurality of memory buffers in order to detect bad memory locations; and, a free buffer list into which the processor places pointers to memory buffers from the plurality of memory buffers for which no bad memory locations have been detected;

wherein memory buffers which have bad memory locations are permanently identified by permanently setting bad memory locations to a particular value.

\* \* \* \* \*